United States Patent
Li et al.

(10) Patent No.: US 10,056,452 B2
(45) Date of Patent: Aug. 21, 2018

(54) METHOD FOR MANUFACTURING VERTICAL SUPER JUNCTION DRIFT LAYER OF POWER SEMICONDUCTOR DEVICES

(71) Applicants: UNIVERSITY OF ELECTRONIC SCIENCE AND TECHNOLOGY OF CHINA, Chengdu (CN); ELECTRONIC AND INFORMATION ENGINEERING IN DONGGUAN, UESTC, Dongguan (CN)

(72) Inventors: Zehong Li, Chengdu (CN); Wenlong Song, Chengdu (CN); Xunyi Song, Chengdu (CN); Hongming Gu, Chengdu (CN); Youbiao Zou, Chengdu (CN); Jinping Zhang, Chengdu (CN); Bo Zhang, Chengdu (CN)

(73) Assignees: UNIVERSITY OF ELECTRONIC SCIENCE AND TECHNOLOGY OF CHINA, Chengdu (CN); ELECTRONIC AND INFORMATION ENGINEERING IN DONGGUAN, UESTC, Dongguan (CN)

( * ) Notice: Subject to any disclaimer, the term of this patent is extended or adjusted under 35 U.S.C. 154(b) by 0 days.

(21) Appl. No.: 15/197,701

(22) Filed: Jun. 29, 2016

(65) Prior Publication Data
US 2016/0315142 A1 Oct. 27, 2016

Related U.S. Application Data

(63) Continuation-in-part of application No. PCT/CN2013/090850, filed on Dec. 30, 2013.

(51) Int. Cl.
*H01L 29/06* (2006.01)
*H01L 29/66* (2006.01)
(Continued)

(52) U.S. Cl.
CPC ........ *H01L 29/0634* (2013.01); *H01L 21/263* (2013.01); *H01L 21/26506* (2013.01);
(Continued)

(58) Field of Classification Search
None
See application file for complete search history.

(56) References Cited

U.S. PATENT DOCUMENTS

2012/0299094 A1* 11/2012 Lee ............... H01L 29/0634
257/341
2013/0032896 A1* 2/2013 Nakajima ....... H01L 29/7802
257/409
(Continued)

*Primary Examiner* — Andres Munoz
(74) *Attorney, Agent, or Firm* — Matthias Scholl P.C.; Matthias Scholl

(57) ABSTRACT

A method for manufacturing a vertical super junction drift layer of a power semiconductor device. The method includes: a): adopting a P+ single crystal silicon to prepare a P+ substrate; b): finishing top processes of the devices on the P+ substrate, forming at least a P type region, manufacturing active area and metallizing the top surface of the P+ substrate; c): thinning the back surface of the P+ single crystal silicon; d): selectively implanting $H^+$ ions at the back surface repeatedly and then annealing to form N pillars in the P type region; and e): metallizing the back surface.

6 Claims, 19 Drawing Sheets

(51) Int. Cl.
*H01L 29/78* (2006.01)
*H01L 21/263* (2006.01)
*H01L 21/265* (2006.01)
*H01L 29/739* (2006.01)
*H01L 29/08* (2006.01)
*H01L 29/10* (2006.01)
*H01L 21/324* (2006.01)

(52) U.S. Cl.
CPC .. *H01L 21/26513* (2013.01); *H01L 29/66333* (2013.01); *H01L 29/66712* (2013.01); *H01L 29/7395* (2013.01); *H01L 29/7802* (2013.01); *H01L 21/324* (2013.01); *H01L 29/0878* (2013.01); *H01L 29/1095* (2013.01)

(56) References Cited

U.S. PATENT DOCUMENTS

2013/0277763 A1* 10/2013 Ohta .................. H01L 29/0634
                                                       257/409
2014/0242769 A1*  8/2014 Yamada ............ H01L 29/66477
                                                       438/289

* cited by examiner

METHOD FOR MANUFACTURING VERTICAL SUPER JUNCTION DRIFT LAYER OF POWER SEMICONDUCTOR DEVICES

CROSS-REFERENCE TO RELATED APPLICATIONS

This application is a continuation-in-part of International Patent Application No. PCT/CN2013/090850 with an international filing date of Dec. 30, 2013, designating the United States, now pending, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, and Cambridge, Mass. 02142.

BACKGROUND OF THE INVENTION

Field of the Invention

The invention relates to a method for manufacturing a vertical super junction drift layer of power semiconductor devices.

Description of the Related Art

Typically, the super junction (SJ) drift layer of a power semiconductor device is prepared by (1) multi-epitaxial growth technology, as shown in FIG. 1, or, by (2) deep trench etching-epitaxial growth technology, as shown in FIG. 2.

However, the two methods have the following disadvantages; the first method requires strict processing accuracy and thus, results in high process costs, while the second method involves an epitaxial filling process, which is complex and often causes the formation of cavities. These pose a reliability risk.

SUMMARY OF THE INVENTION

In view of the above-described problems, it is one objective of the invention to provide a method for manufacturing a vertical super junction drift layer of power semiconductor devices.

To achieve the above objective, in accordance with one embodiment of the invention, there is provided a method for manufacturing a vertical super junction drift layer of power semiconductor devices, the method comprising:
a) using a P+ single crystal silicon to prepare a P+ substrate;
b) finishing top processes of the devices on the P+ substrate, forming at least a P pillar, manufacturing active area and metallizing the top surface;
c) thinning the back surface;
d) selectively implanting $H^+$ ions at the back surface repeatedly and then annealing at low temperature to form N pillars in the P type region; and
e) metallizing the back surface.

Specifically, step b also comprises the following steps:
b1) forming a P type region through epitaxial growth on the P+ substrate;
b2) forming an N type region through epitaxial growth on the P type region;
b3) growing a field oxide layer on the N type region;
b4) etching an active area in the N type region;
b5) growing a gate oxide on the N type region;
b6) depositing and etching polysilicon on the gate oxide;
b7) implanting boron ions in the N-type region and then performing a drive-in to form a P-body base region;
b8) implanting arsenic ions in the P-body base region and then performing a drive-in to form an $N^+$ source region;
b9) depositing boro-phospho-silicate-glass (BPSG) on the P-body base region and then reflowing;
b10) etching contact holes on the P-body base region;
b11) implanting boron ions in the P-body base region and then annealing to form a P+ contact region; and
b12) metallizing the top surface and forming an emitter on the BPSG.

Further, step d) comprises: selectively implanting $H^+$ ions at the back surface repeatedly and annealing to form the N pillars in the P-type region, repeating implanting $H^+$ ions and then annealing to form an N-Field stop layer between the P+ substrate and the super junction structure.

Specifically, step b also comprises the following steps:
b1) forming an N-Field stop layer through epitaxial growth on the P+ substrate;
b2) forming a P-type region through epitaxial growth on the N-Field stop layer;
b3) forming an N-type region through epitaxial growth on the P-type region;
b4) growing a field oxide layer on the N-type region;
b5) etching an active area in the N type region;
b6) growing a gate oxide on the N type region;
b7) depositing and etching polysilicon on the gate oxide;
b8) implanting boron ions in the N-type region and then performing a drive-in to form a P-body base region;
b9) implanting arsenic ions in the P-body base region and then performing a drive-in to form an $N^+$ source region;
b10) depositing boro-phospho-silicate-glass (BPSG) on the P-body base region and then reflowing;
b11) etching contact holes on the P-body base region;
b12) implanting boron ions in the P-body base region and then annealing to form a P+ contact region; and
b13) metallizing the top surface and forming an emitter on the BPSG.

Specifically, step b also comprises the following steps:
b1) forming a P type region through epitaxial growth on the P+ substrate;
b2) implanting phosphorus ions or arsenic ions at the top surface and then performing a drive-in to form an N-type region in the P-type region;
b3) growing a field oxide layer on the N type region;
b4) etching an active area in the N type region;
b5) growing a gate oxide on the N type region;
b6) depositing and etching polysilicon on the gate oxide;
b7) implanting boron ions in the N-type region and then performing a drive-in to form a P-body base region 17;
b8) implanting arsenic ions in the P-body base region and then performing a drive-in to form an $N^+$ source region;
b9) depositing BPSG on the P-body base region and then reflowing;
b10) etching contact holes on the P-body base region;
b11) implanting boron ions in the P-body base region and then annealing to form a P+ contact region; and
b12) metallizing the top surface and forming an emitter on the BPSG.

Further, step d) comprises: selectively implanting $H^+$ ions at the back surface repeatedly and annealing to form the N pillars in the P-type region, repeating implanting $H^+$ ions and then annealing to form an N-Field stop layer between the P+ substrate and the super junction structure.

Specifically, step b comprises the following steps:
b1) forming an N-Field stop layer through epitaxial growth on the P+ substrate;
b2) forming a P-type region through epitaxial growth on the N-Field stop layer;
b3) implanting phosphorus ions or arsenic ions at the top surface and then performing a drive-in to form an N-type region in the P-type region;
b4) growing a field oxide layer on the N type region;
b5) etching an active area in the N type region;
b6) growing a gate oxide on the N type region;
b7) depositing and etching polysilicon on the gate oxide;
b8) implanting boron ions in the N-type region and then performing a drive-in to form a P-body base region;
b9) implanting arsenic ions in the P-body base region and then performing a drive-in to form an $N^+$ source region;
b10) depositing BPSG on the P-body base region and then reflowing;
b11) etching contact holes on the P-body base region;
b12) implanting boron ions in the P-body base region and then annealing to form a P+ contact region; and
b13) metallizing the top surface and forming an emitter on the BPSG.

The method of the invention has the advantages of simple manufacturing process and reduced process costs.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a method for manufacturing a vertical super junction drift layer of power semiconductor devices are described below. It should be noted that the following examples are intended to describe and not to limit the invention.

Figure 1:
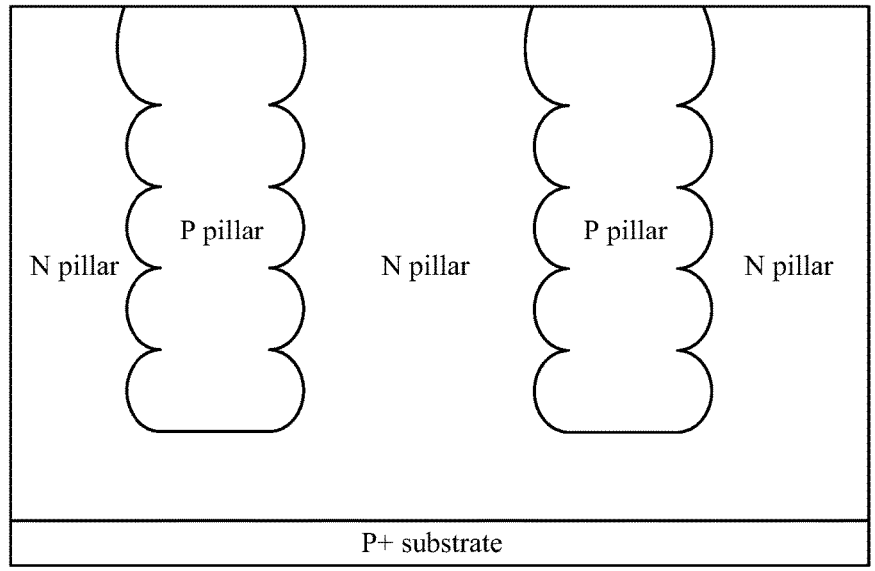
FIG. 1 is a schematic cross-sectional view of SJ-IGBT manufactured by conventional multi-epitaxial growth technology.
Figure 2:
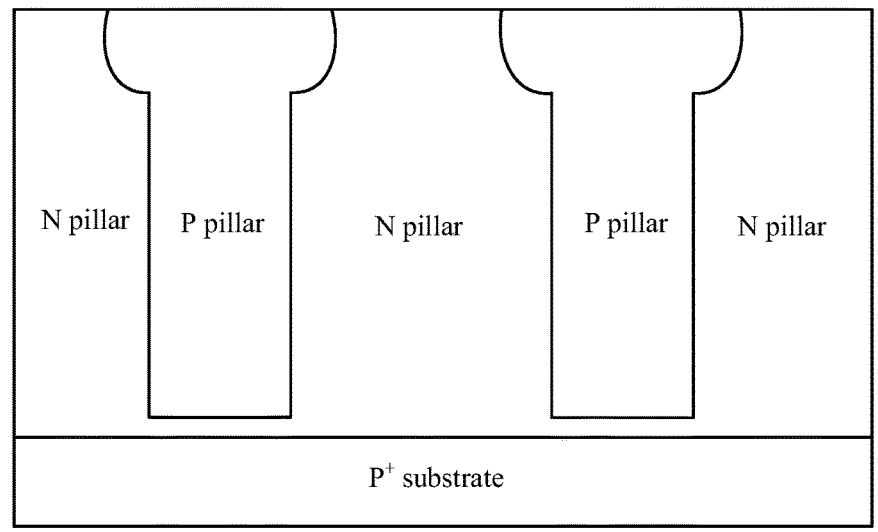
FIG. 2 is a schematic cross-sectional view of SJ-IGBT manufactured by conventional deep trench etching-epitaxial growth technology.
Figure 3:
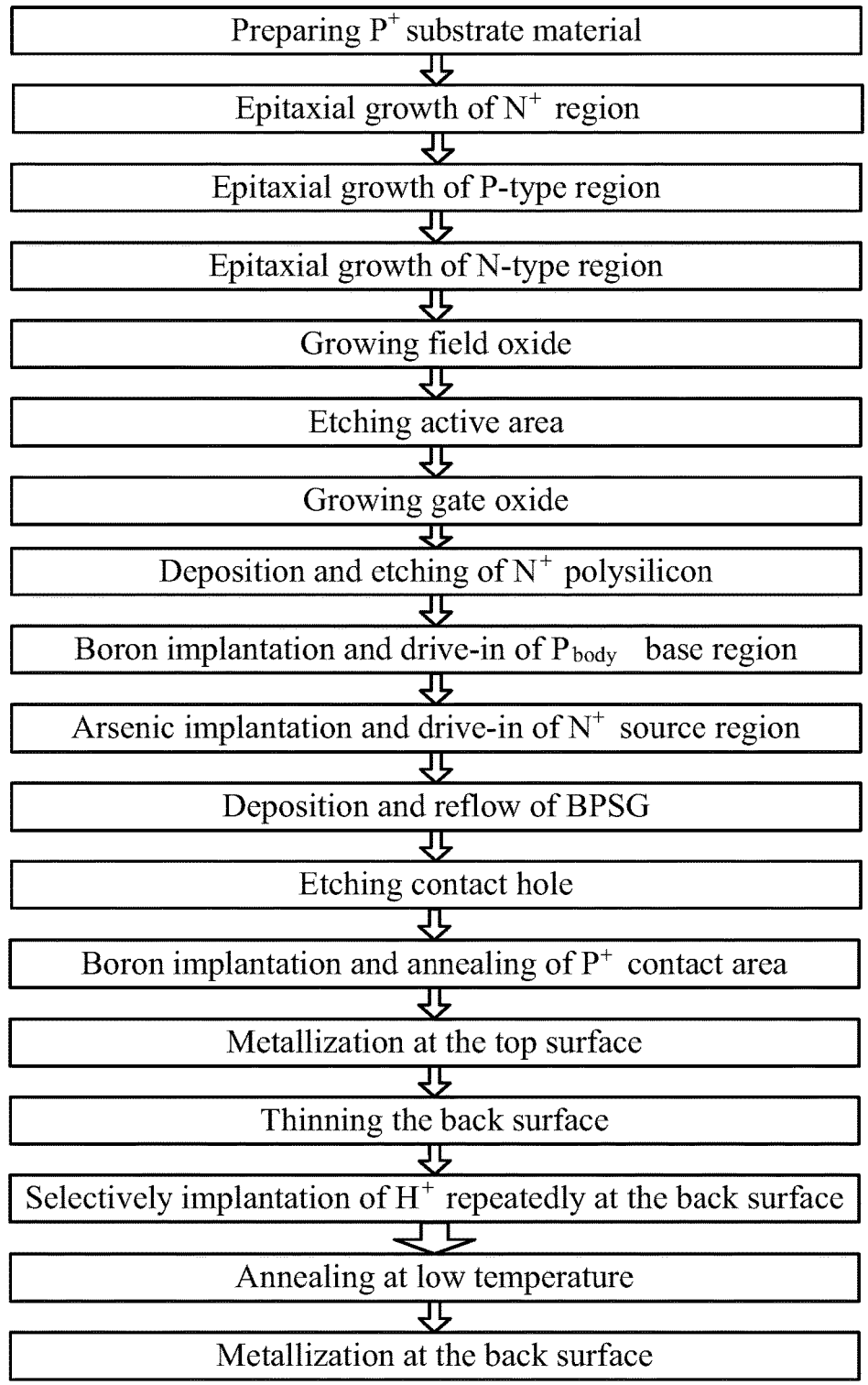
FIG. 3 is a flow chart of a method of manufacturing a vertical super junction drift layer, according to the first embodiment of the invention.

As shown in FIG. 3, the first embodiment of the invention provides a method for manufacturing a vertical super junction drift layer of power semiconductor devices, the method comprising the following steps:
1) using a P+ single crystal silicon to prepare a P+ substrate 11;
2) forming a P type region 12 through epitaxial growth on the P+ substrate 11;
3) forming the N type region 13 through epitaxial growth on the P type region 13;
4) growing a field oxide layer 14 on the N type region 13;
5) etching active area in the N type region 13;
6) growing a gate oxide 15 on the N type region 13;
7) depositing and etching polysilicon 16 on gate oxide 15;
8) implanting boron ions in the N-type region 13 and then performing a drive-in to form the P-body base region 17;
9) implanting arsenic ions in the P-body base region 17 and then performing a drive-in to form an $N^+$ source region;
10) deposition BPSG 19 on the P-body base region 17 and then reflowing;
11) etching contact holes 20 on the P-body base region 17;
12) implanting boron ions in the P-body base region 17 and then annealing to form a P+ contact region 21;
13) metallizing the top surface and forming an emitter 22 on BPSG 19.
14) thinning the back surface;

15) selectively implanting H⁺ ions at the back surface repeatedly and then annealing at low temperature to form N pillars 25 in the P type region 12;
16) metallizing the back surface.

Figure 4:
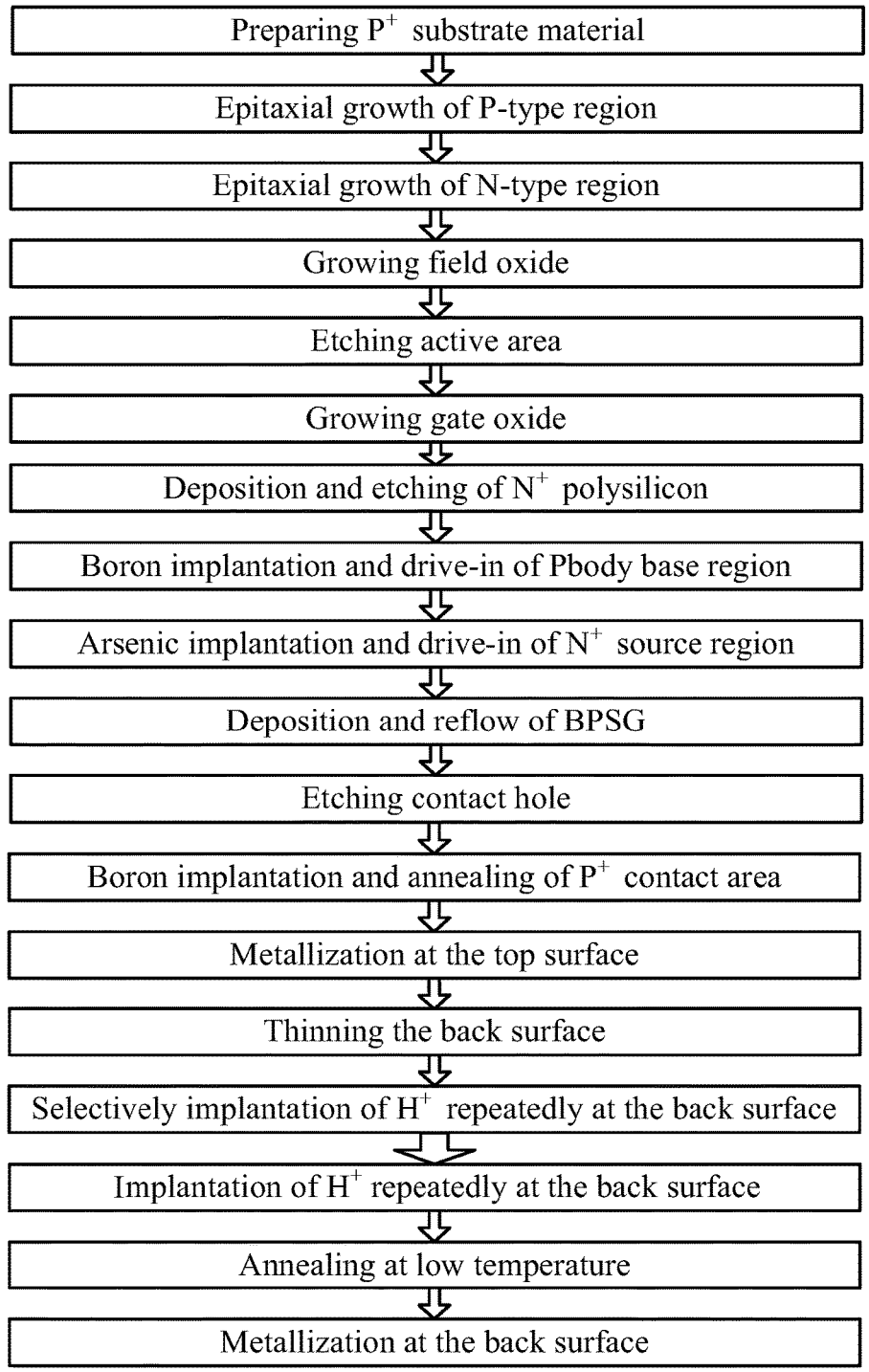
FIG. 4 is a flow chart of a method of manufacturing a vertical super junction drift layer, according to the second embodiment of the invention.

As shown in FIG. 4, the second embodiment of the invention provides a method for manufacturing a vertical super junction drift layer of power semiconductor devices. Based on the first manufacturing method, the second one provides a simplified process to form an N-Field stop layer 24. The detailed process is as follows; after selectively implanting H⁺ ions at the back surface repeatedly and annealing at low temperature to form N pillars 25 in the P-type region 12, implant H⁺ ions repeatedly once again and then anneal to form the N-Field stop layer 24 between the P+ substrate 11 and the super junction structure.

Figure 5:
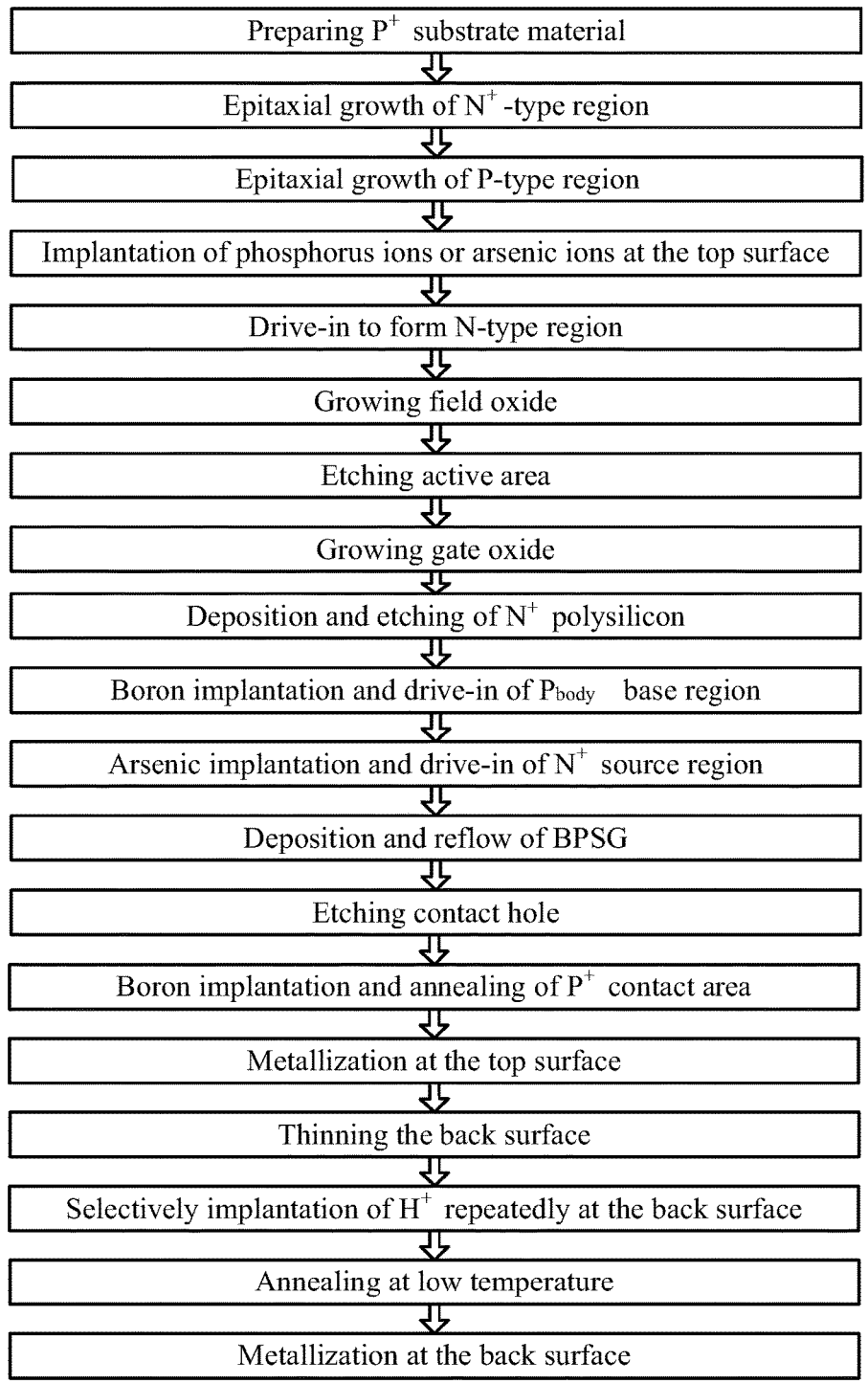
FIG. 5 is a flow chart of a method of manufacturing a vertical super junction drift layer, according to the third embodiment of the invention.

As shown in FIG. 5, the third embodiment of the invention provides a method for manufacturing a vertical super junction drift layer of power semiconductor devices, comprising the following steps:
1) using a P+ single crystal silicon to prepare a P+ substrate 11;
2) forming a P type region 12 through epitaxial growth on the P+ substrate 11;
3) implanting phosphorus ions or arsenic ions at the top surface and then performing a drive-in to form the N-type region 13 in the P-type region 12;
4) growing a field oxide layer 14 on the N type region 13;
5) etching an active area in the N type region 13;
6) growing a gate oxide 15 on the N type region 13;
7) depositing and etching polysilicon 16 on the gate oxide 15;
8) implanting boron ions in the N-type region 13 and then performing a drive-in to form the P-body base region 17;
9) implanting arsenic ions in the P-body base region 17 and then performing a drive-in to form an N⁺ source region;
10) deposition of BPSG 19 on the P-body base region 17 and then reflowing;
11) etching contact holes 20 on the P-body base region 17;
12) implanting boron ions in the P-body base region 17 and then annealing to form a P+ contact region 21;
13) metallizing the top surface and forming an emitter 22 on BPSG 19;
14) thinning the back surface;
15) selectively implanting H⁺ ions at the back surface repeatedly and then annealing at low temperature to form N pillars 25 in the P type region 12; and
16) metallizing the back surface.

Figure 6:
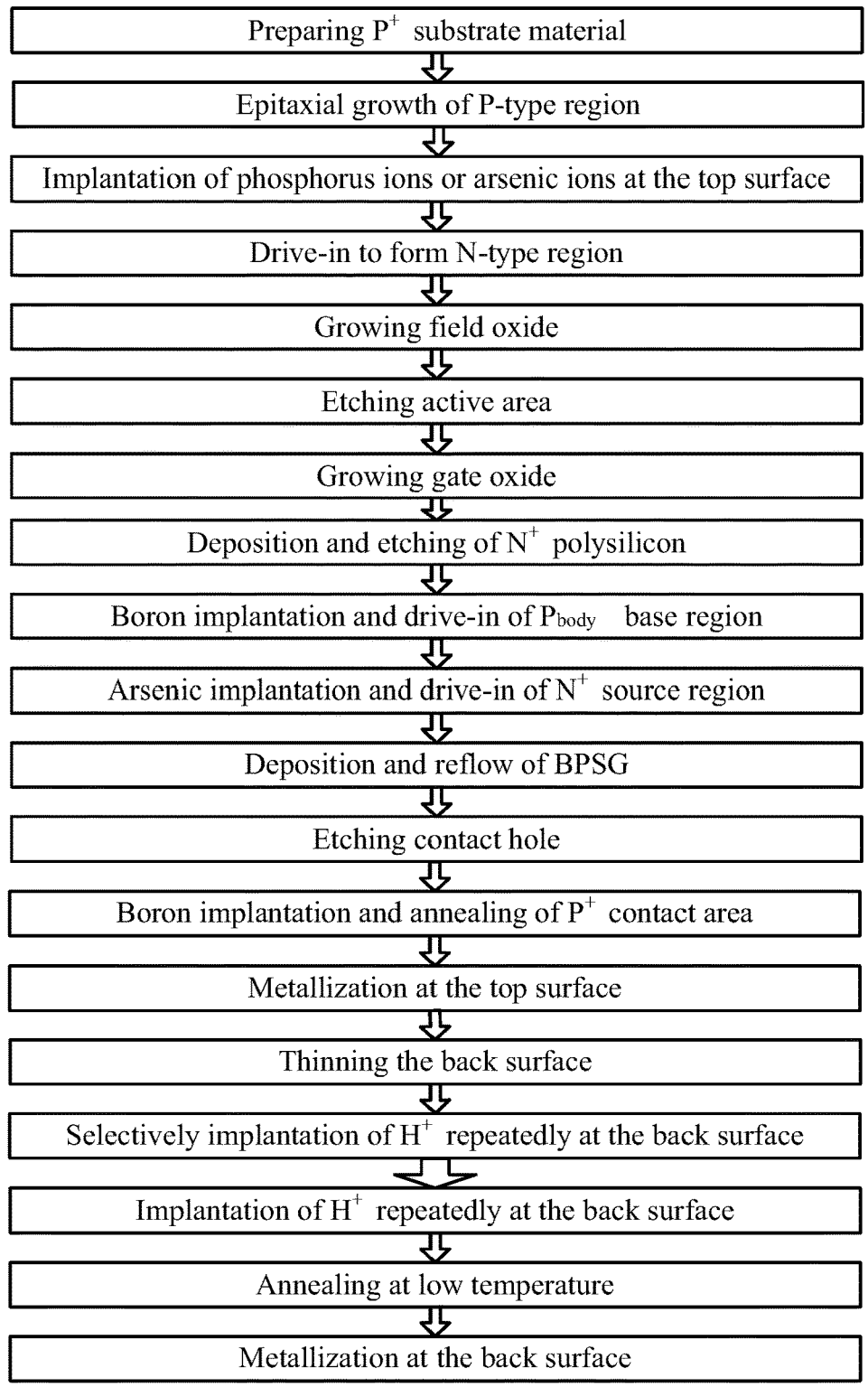
FIG. 6 is a flow chart of a method of manufacturing a vertical super junction drift layer, according to the fourth embodiment of the invention.

As shown in FIG. 6, the fourth embodiment of the invention provides a method for manufacturing a vertical super junction drift layer of power semiconductor devices. Based on the third manufacturing method, the fourth one provides a simplified process to form an N-Field stop layer 24. The detailed process is as follows; after selectively implanting H⁺ ions at the back surface repeatedly and annealing at low temperature to form N pillars 25 in the P-type region 12, implant H⁺ ions repeatedly once again and then anneal to form the N-Field stop layer 24 between the P+ substrate 11 and the super junction structure.

According to the above technical solutions, the difference between the first manufacturing method and the third one is the forming method of the N-type region 13. For the first and third technical solutions, the N-type region 13 is formed by epitaxial growth and drive-in, respectively.

The essence of the invention is that a P+ single crystal is chosen as a substrate. Firstly, the P-type layer is grown on the surface of a P+ single crystal substrate through epitaxial growth, which acts as a voltage-sustaining layer of the super junction structure. Then N-type layer is formed on the surface of the P-type layer through epitaxy or ions implanting and drive-in, wherein MOS structure is formed. After the completion of a top process, the back surface of the device is thinned. Thereafter, the N pillars in the super junction structure is formed through H⁺ ions selectively being implanted repeatedly and annealing at low temperature. After selectively implanting H⁺ ions at the back surface repeatedly and annealing at low temperature, H⁺ ions can be implanted repeatedly at the back surface once again and annealing is done at the same temperature if the N-Field stop layer between the super junction structure and the P+ substrate is needed for the device. Then, a super junction structure with the N-Field stop layer can be obtained.

The working principle of this invention is as follows:
The basic technical solution of the invention is that the P-type layer and the N-type layer are grown on the P+ single crystal substrate through epitaxial growth. The P-type layer is used to sustain voltage and the N-type layer is used to form a planar gate MOS structure at the top surface. After the completion of the top planar gate MOS process and thinning, H⁺ ions selective implantation and H⁺ ions implantation are done in order. Thereafter, annealing at low temperature to activate the donors related to H⁺ ions, so as to form N-type pillars and an N-Field stop layer 24, decrease the concentration of recombination centers and broaden the distribution range of peak concentrations. Thus, the processes of metallizing the back surface and so on are done to form the complete structure.

Because the radius and mass of hydrogen are both the smallest among chemical elements, the diffusion velocity of H⁺ ion in silicon is fast. This is especially so up to 1000 degree centigrade thermal process, as all of the H⁺ ions may diffuse to the surface, which results in a non-uniform concentration distribution. Meanwhile, H⁺ ions are easy to accelerate to high energy and high penetration, which is easy to cause deep implantation. For example, when H⁺ ions are implanted with the energy of 2 MeV, the projected range Rp is 47.69 μm and the corresponding vertical discrete deviation and lateral discrete deviation are 2.04 μm and 2.56 μm, respectively. When H⁺ ions are implanted with the energy of 3 MeV, the projected range Rp can reach up to 92.05 μm and the corresponding vertical discrete deviation and lateral discrete deviation are 4.06 μm and 4.66 μm, respectively. When H⁺ ions are implanted with high energy, a large number of defects and recombination centers are produced within the scope of the projected range. Through low temperature annealing, the donors related to hydrogen (for example, thermal donors at shallow energy level and so on) can be activated and then the P-type epitaxial layer is changed to N pillars with a needed peak concentration. Moreover, the concentration of recombination centers (for example, divacancies, oxygen-vacancy compounds) is reduced. The high energy implantation of H⁺ ions will introduce an N-type peak concentration near projected range Rp. From the top surface of silicon to the location of Rp, the N-type concentration is prone to constant value. Through H⁺ implantation repeatedly, implantation energy and dose optimization, the concentration uniformity within the scope of the projected range can be guaranteed. In the process of low temperature annealing, the temperature is usually controlled in the range of 350-420 degree centigrade. If the annealing temperature is raised to the range of 420-550 degree centigrade, the zone with N-type peak concentration caused by H⁺ ions will be broadened significantly and the number of H+ ions implantation can be decreased. Table 1 shows the corresponding projected range Rp, vertical discrete deviation and lateral discrete deviation when the energy of H+ ions implantation is in the range of 0.5-3.5 MeV

TABLE 1

Test-data Table With Corresponding Projected Range Rp, Vertical Discrete Deviation and Lateral Discrete Deviation When the Energy of H+ ions Implantation is in the Range of 0.5-3.5 MeV

| Implantation energy E/MeV | Projected range $R_P$/µm | Vertical discrete deviation/µm | Lateral discrete deviation/µm |
| --- | --- | --- | --- |
| 0.5 | 5.99 | 0.31 | 0.44 |
| 0.55 | 6.85 | 0.35 | 0.49 |
| 0.6 | 7.75 | 0.39 | 0.54 |
| 0.65 | 8.69 | 0.42 | 0.59 |
| 0.7 | 9.67 | 0.46 | 0.64 |
| 0.8 | 11.74 | 0.57 | 0.75 |
| 0.9 | 13.97 | 0.68 | 0.87 |
| 1.00 | 16.33 | 0.79 | 1.00 |
| 1.10 | 18.84 | 0.90 | 1.13 |
| 1.20 | 21.48 | 1.00 | 1.26 |
| 1.30 | 24.28 | 1.11 | 1.40 |
| 1.40 | 27.22 | 1.21 | 1.55 |
| 1.50 | 30.29 | 1.32 | 1.71 |
| 1.60 | 33.50 | 1.44 | 1.87 |
| 1.70 | 36.85 | 1.55 | 2.03 |
| 1.80 | 40.33 | 1.66 | 2.20 |
| 2.00 | 47.69 | 2.04 | 2.56 |
| 2.25 | 57.61 | 2.56 | 3.03 |
| 2.50 | 68.32 | 3.07 | 3.54 |
| 2.75 | 79.80 | 3.56 | 4.08 |
| 3.00 | 92.05 | 4.06 | 4.66 |
| 3.25 | 105.03 | 4.56 | 5.26 |
| 3.50 | 118.76 | 5.07 | 5.89 |

As shown in Table 1, for different blocking voltage levels, the number and energy of H+ implantation can be determined according to the needed projected range. The ratio of vertical discrete deviation and the lateral discrete deviation to projected range for H+ ions implantation is only 5%. The foundation for super junction structure achieving high blocking voltage is the charge balance between P pillars and N pillars. The higher for the ratio of charge unbalance, the more the blocking voltage will decrease. As for the ratio of vertical discrete deviation, lateral discrete deviation to projected range for H+ ions implantation is far smaller than the corresponding values for other ions, as the process difficulty for charge balance is reduced.

Example 1

Figure 7:
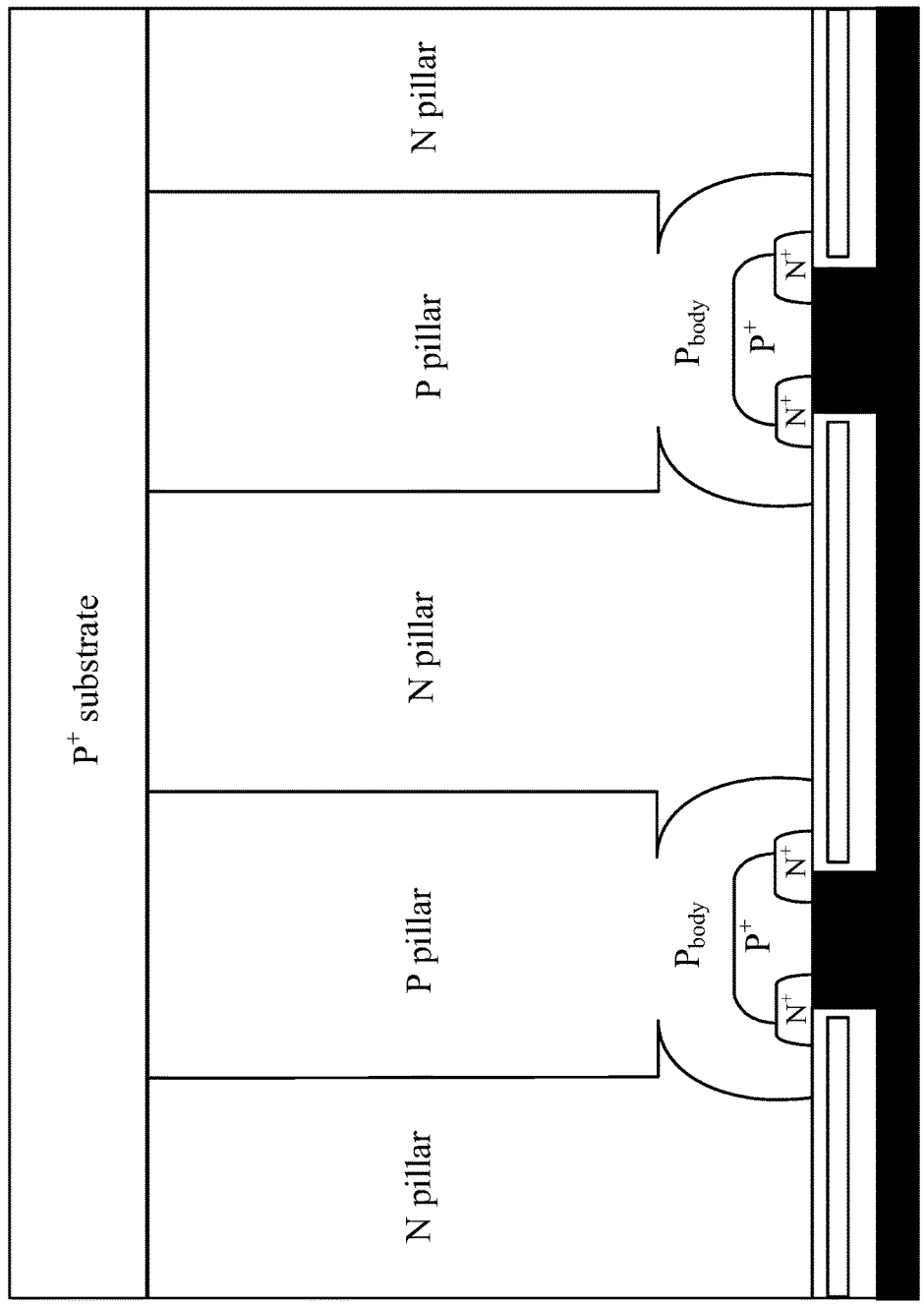
FIG. 7 is a schematic cross-sectional view of SJ-IGBT in accordance with an embodiment.
Figure 8:
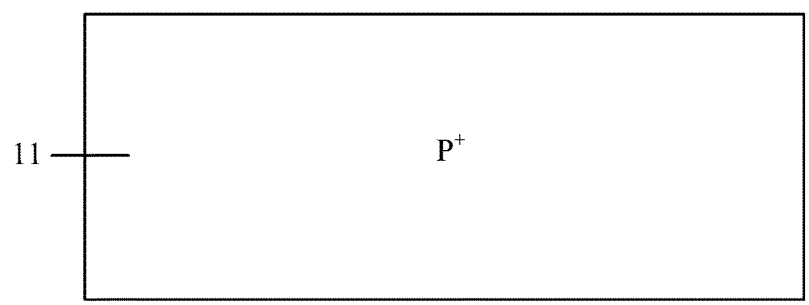
FIG. 8 is a schematic cross-sectional view of a P+ single crystal substrate according to an embodiment that provides growing a semiconductor layer by epitaxy.

Example 1 adopts the technical solution of the invention to manufacture a 600 V SJ-IGBT (the structure is shown in FIG. 7). The detailed process is as follows:

(1) Prepare the material of a P+ single crystal substrate 11, as shown in FIG. 8. The thickness and resistivity of the P+ single crystal substrate 11 are 400-600 µm and 0.0135-0.0375 Ω·cm. The impurity is boron.

Figure 9:
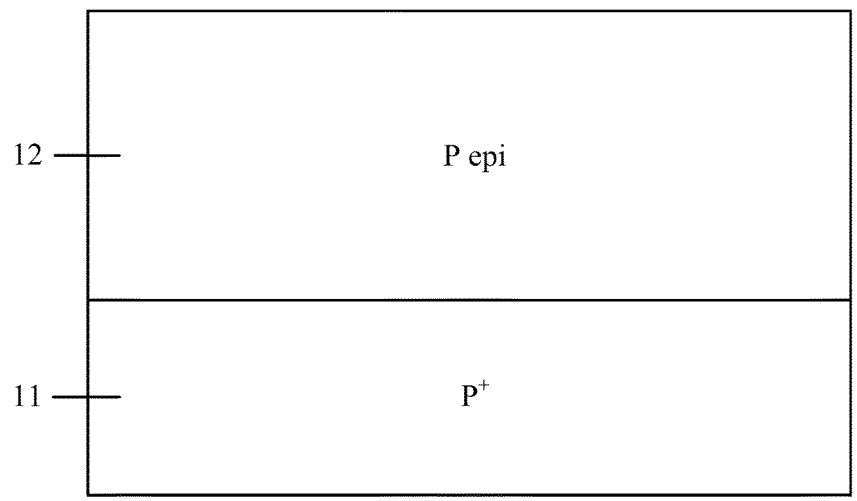
FIG. 9 is a schematic cross-sectional view of growing a P-type region through epitaxial growth in accordance with an embodiment.

(2) Forming a P type region 12 through epitaxial growth, as shown in FIG. 9. The thickness and resistivity of the P-type region 12 are 50 µm and 13.2 Ω·cm, respectively. The temperature for epitaxial growth is 1000-1200 degree centigrade and the impurity is boron.

Figure 10:
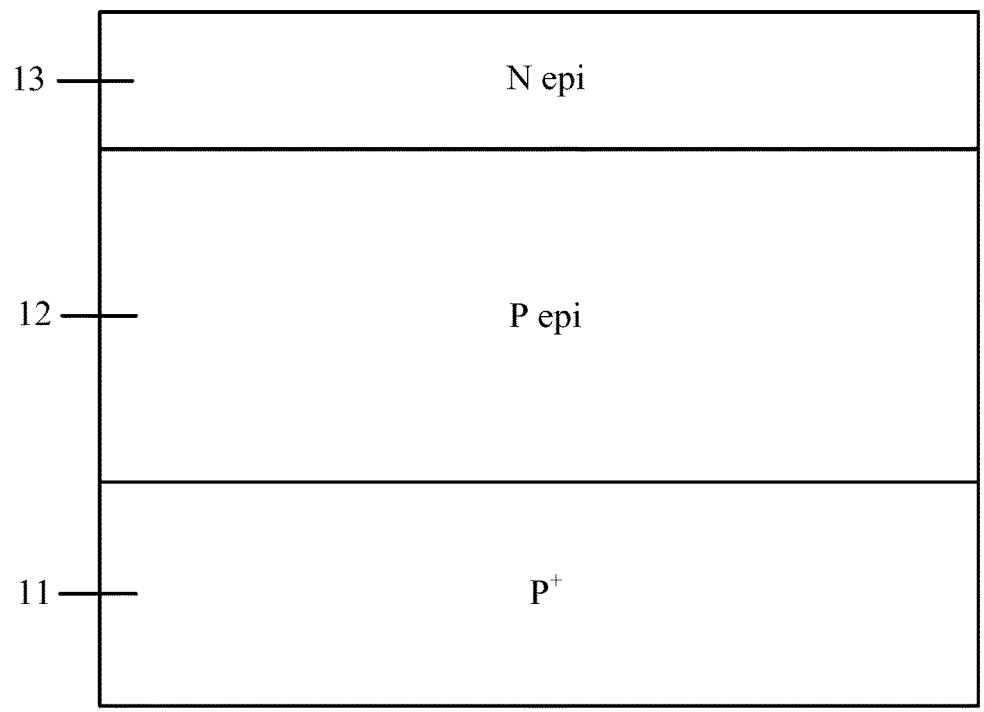
FIG. 10 is a schematic cross-sectional view of growing an N-type region through epitaxial growth according to an embodiment.

(3) Forming an N type region 13 through epitaxial growth, as shown in FIG. 10. The thickness and resistivity of the P-type region 13 are 3 µm and 4.5 Ω·cm, respectively. The temperature for epitaxial growth is 1000-1200 degree centigrade and the impurity is phosphorus or arsenic.

Figure 11:
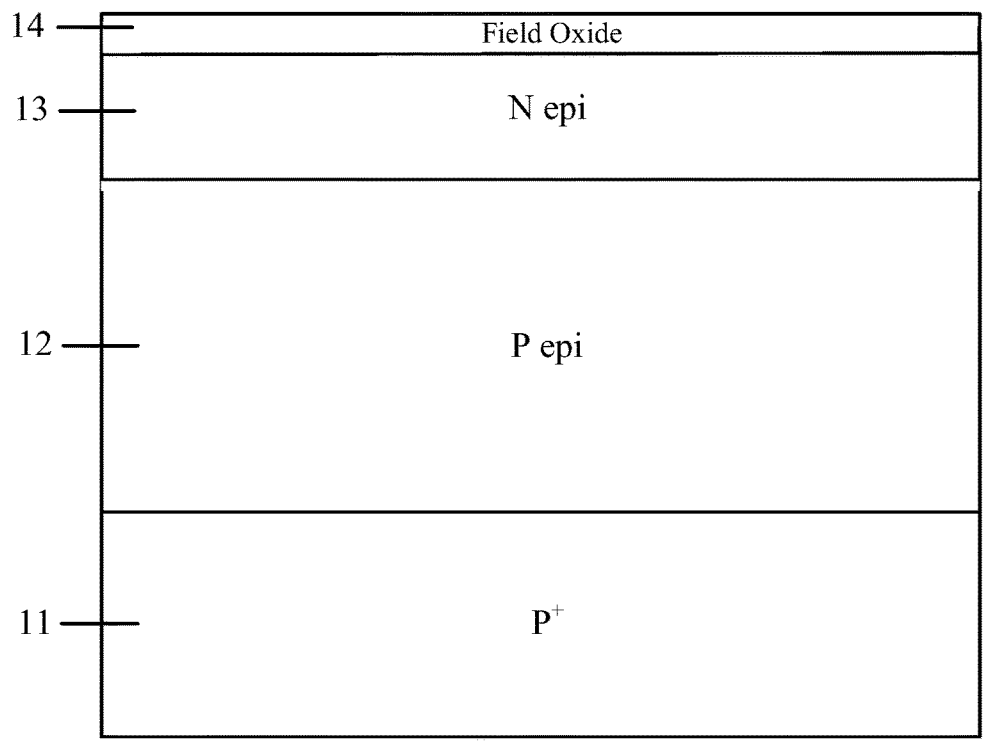
FIG. 11 is a schematic cross-sectional view of growing field oxide in accordance with an embodiment.

(4) Growing a field oxide layer 14, as shown in FIG. 11. The temperature for growing the field oxide 14 is 1000-1200 degree centigrade and the thickness of the field oxide is 0.5-1.5 µm.

Figure 12:
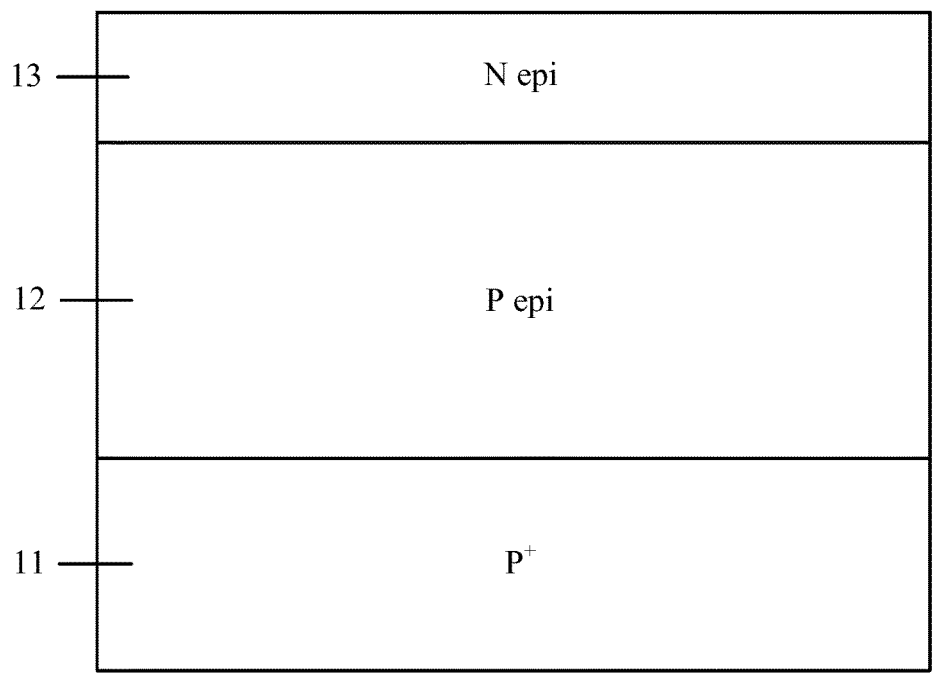
FIG. 12 is a schematic cross-sectional view of etching an active area according to an embodiment.

(5) Etching an active area, as shown in FIG. 12.

Figure 13:
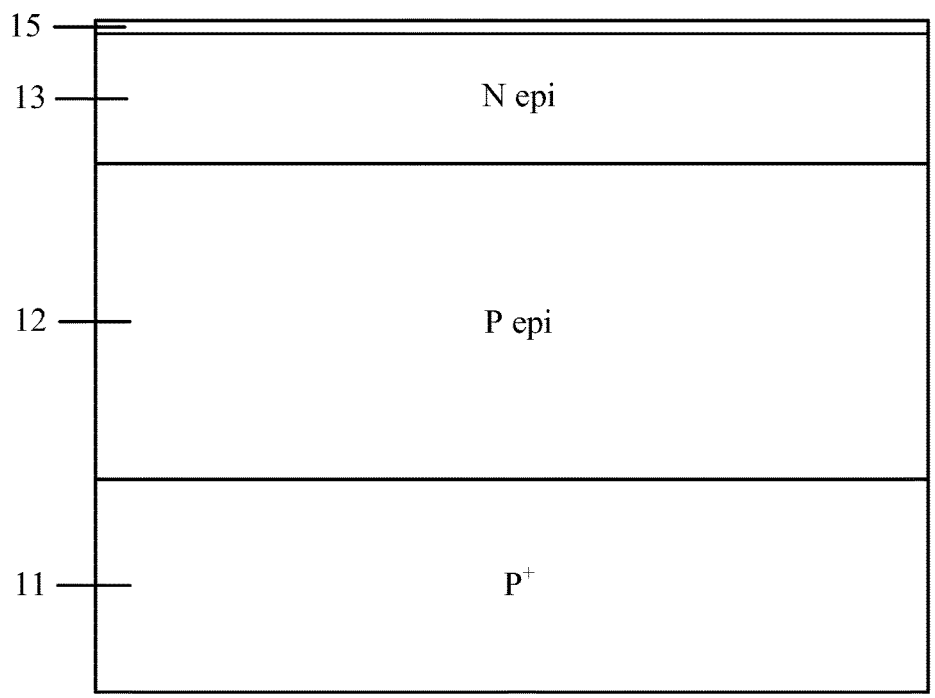
FIG. 13 is a schematic cross-sectional view of growing a gate oxide in accordance with an embodiment.

(6) Growing a gate oxide layer 15, as shown in FIG. 13. The temperature for growing the field oxide 15 is 1000-1100 degree centigrade and the thickness of the field oxide is 40-120 nm.

Figure 14:
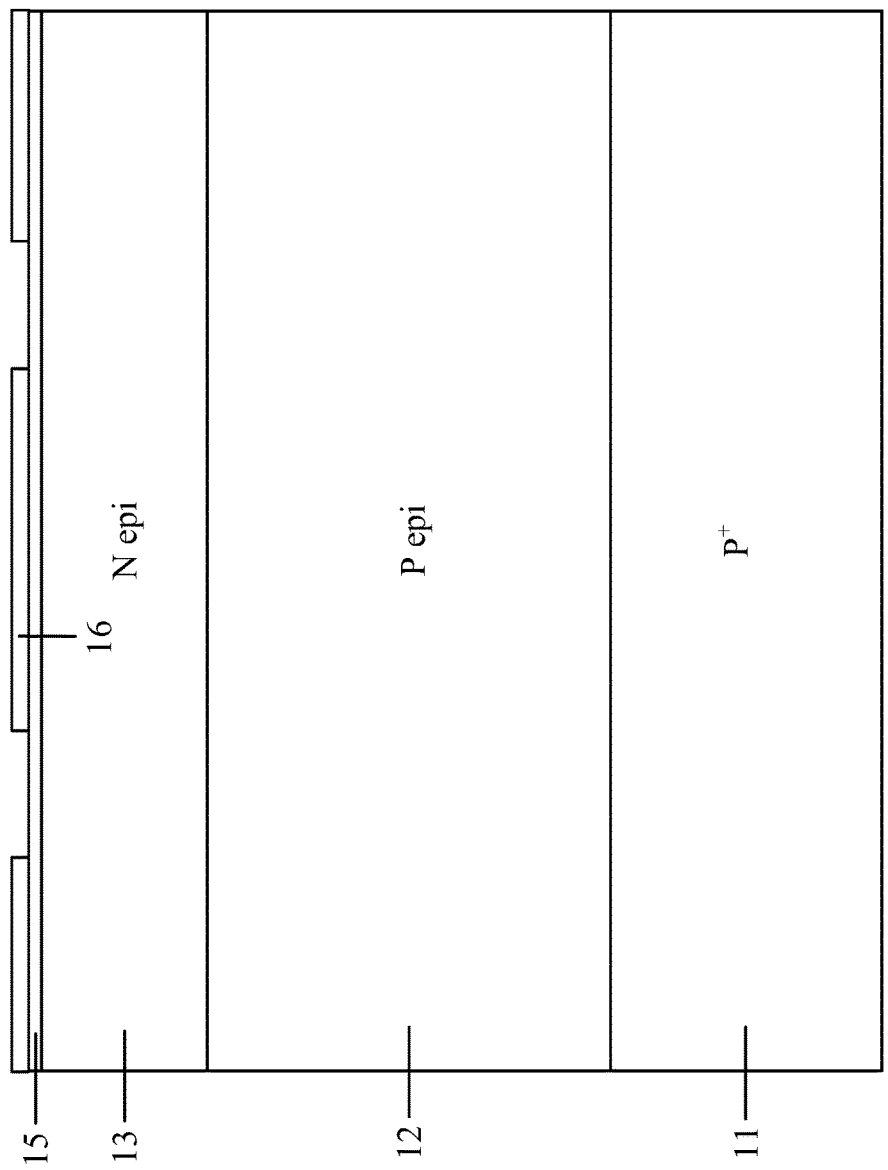
FIG. 14 is a schematic cross-sectional view of the depositing and etching of an polysilicon according to an embodiment.

(7) Depositing and etching polysilicon 16, as shown in FIG. 14. The impurity is phosphorus or arsenic and the concentration is 5e19-1e20 $cm^{-3}$. The deposition temperature is 850 degree centigrade and the thickness of polysilicon is 0.8 µm.

Figure 15:
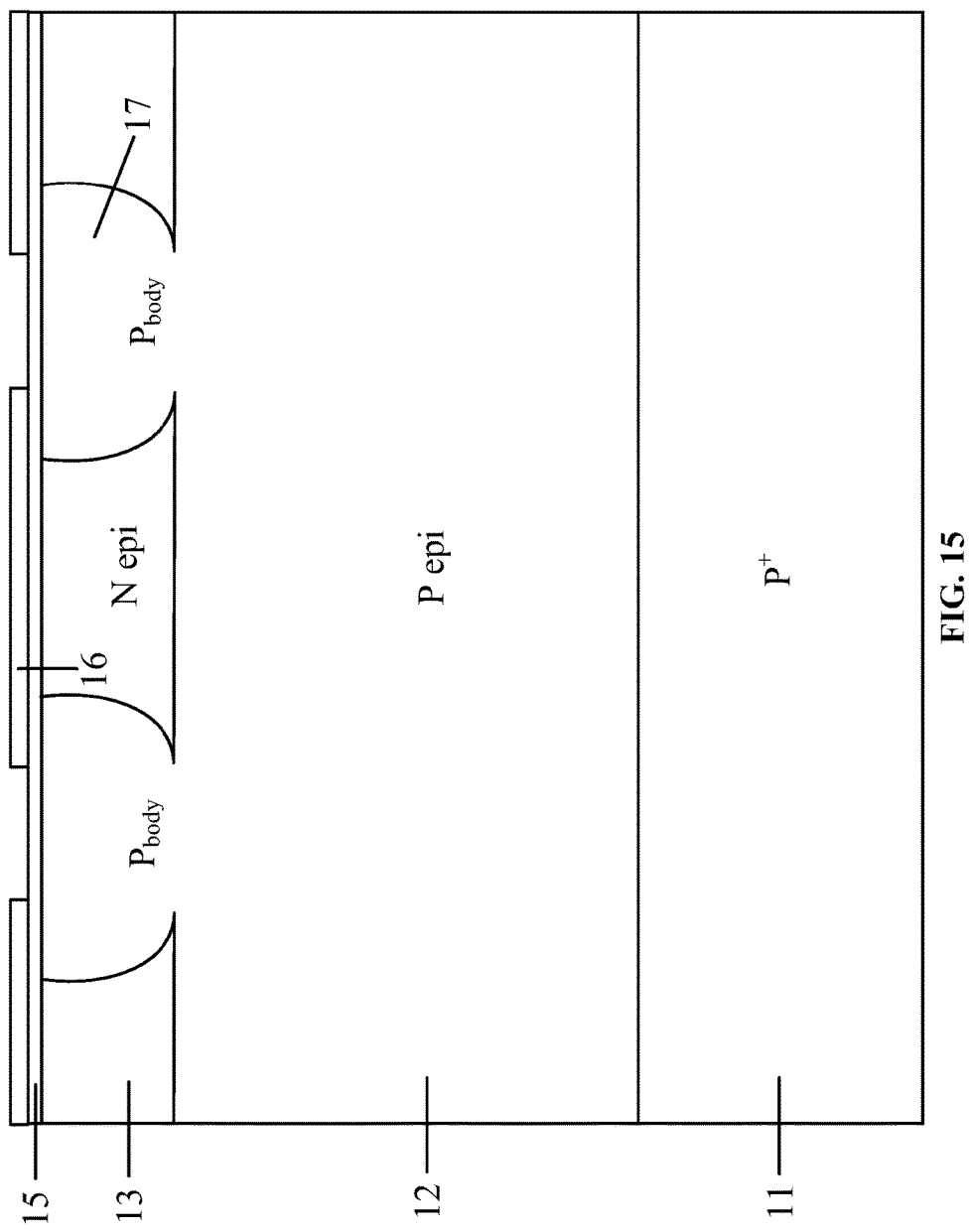
FIG. 15 is a schematic cross-sectional view of boron ions implanting and a drive-in of the P-body base region in accordance with an embodiment.

(8) The boron implantation and drive-in of a P-body base area, as shown in FIG. 15. The implantation dose and energy of boron ions are 2e13 $cm^{-2}$ and 80 KeV, respectively. The drive-in temperature and time are 1100 degree centigrade and 90 minutes, respectively.

Figure 16:
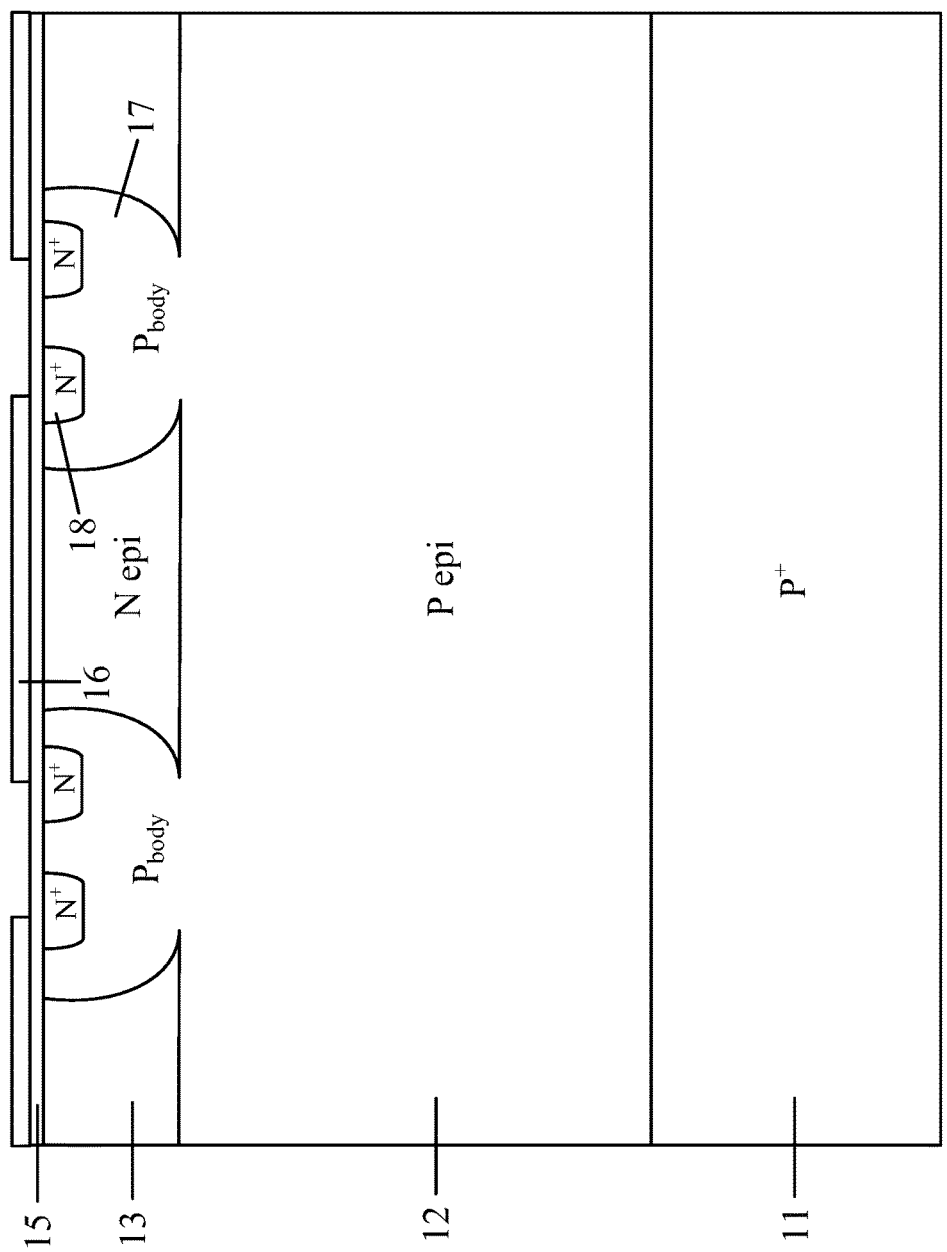
FIG. 16 is a schematic cross-sectional view of arsenic implanting and the drive-in of $N^+$ source region according to an embodiment.

(9) The arsenic implantation and drive-in of an N+ source area, as shown in FIG. 16. The implantation dose and energy of arsenic ions are 2e15 $cm^{-2}$ and 80 KeV, respectively. The drive-in temperature and time are 950 degree centigrade and 40 minutes, respectively.

Figure 17:
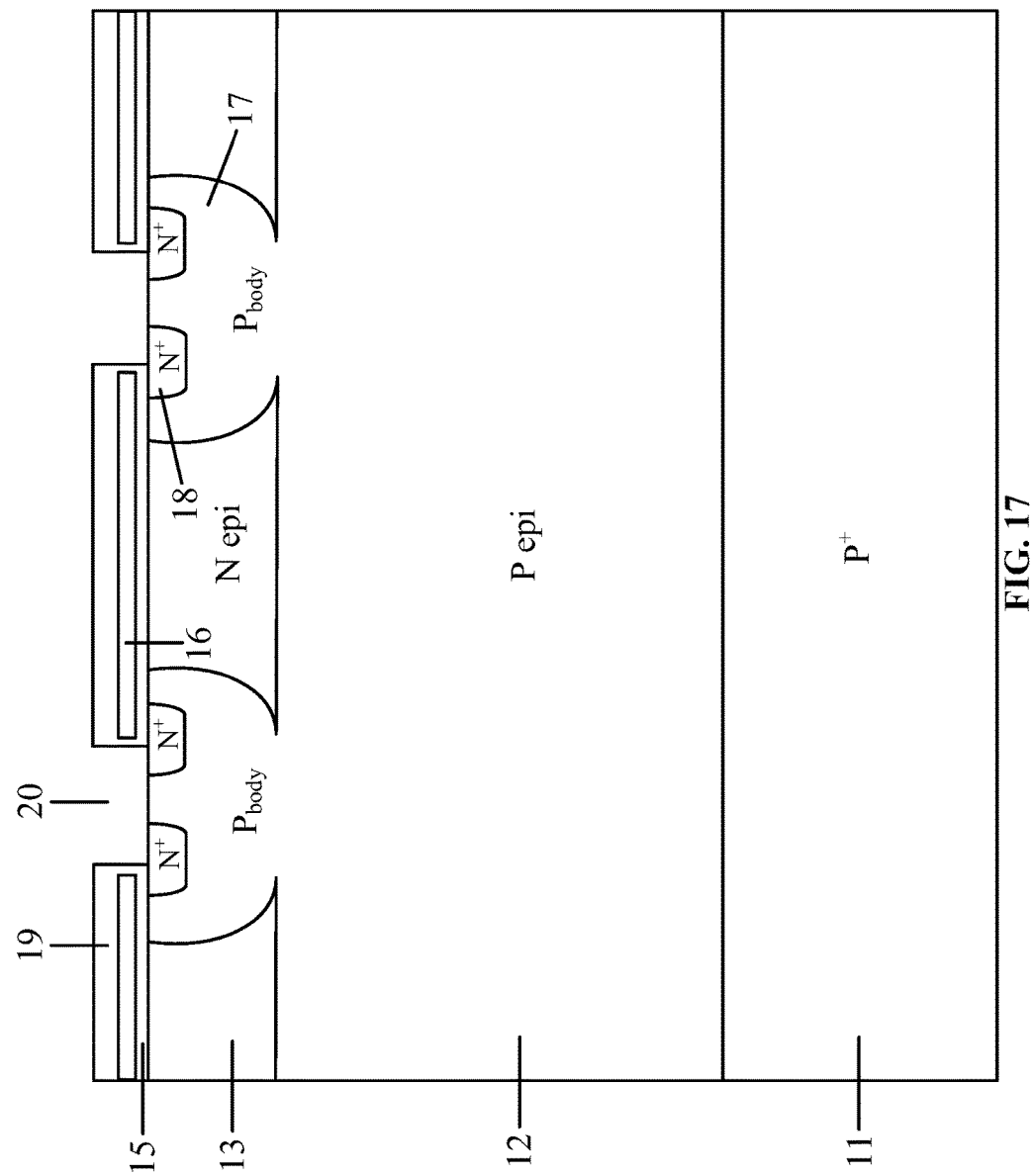
FIG. 17 is a schematic cross-sectional view of deposition and reflow of BPSG and a view of contact holes etching in accordance with an embodiment.

(10) Deposition and reflowing of BPSG 19 and etching contact holes 20, as shown in FIG. 17. The temperature for deposition is 850 degree centigrade and the thickness of BPSG is 1 µm, respectively. The reflow temperature and time are 975 degree centigrade and 50 minutes, respectively.

Figure 18:
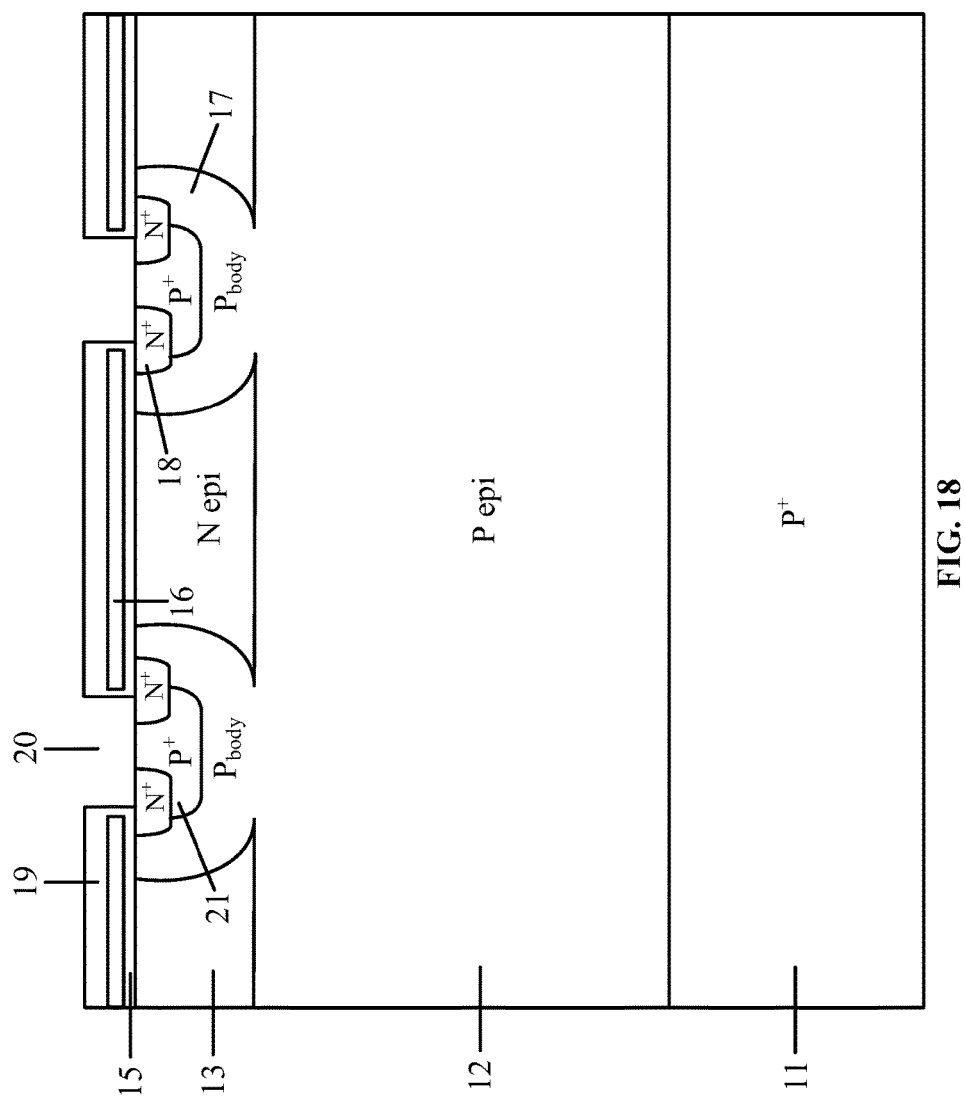
FIG. 18 is a schematic cross-sectional view of boron implanting and a drive-in of P+ contact region according to an embodiment.

(11) The boron implantation and annealing of a P+ contact area, as shown in FIG. 18. The implantation dose and energy of boron ions are 5e15 $cm^{-2}$ and 60 KeV, respectively. The annealing temperature and time are 850 degree centigrade and 40 minutes, respectively.

Figure 19:
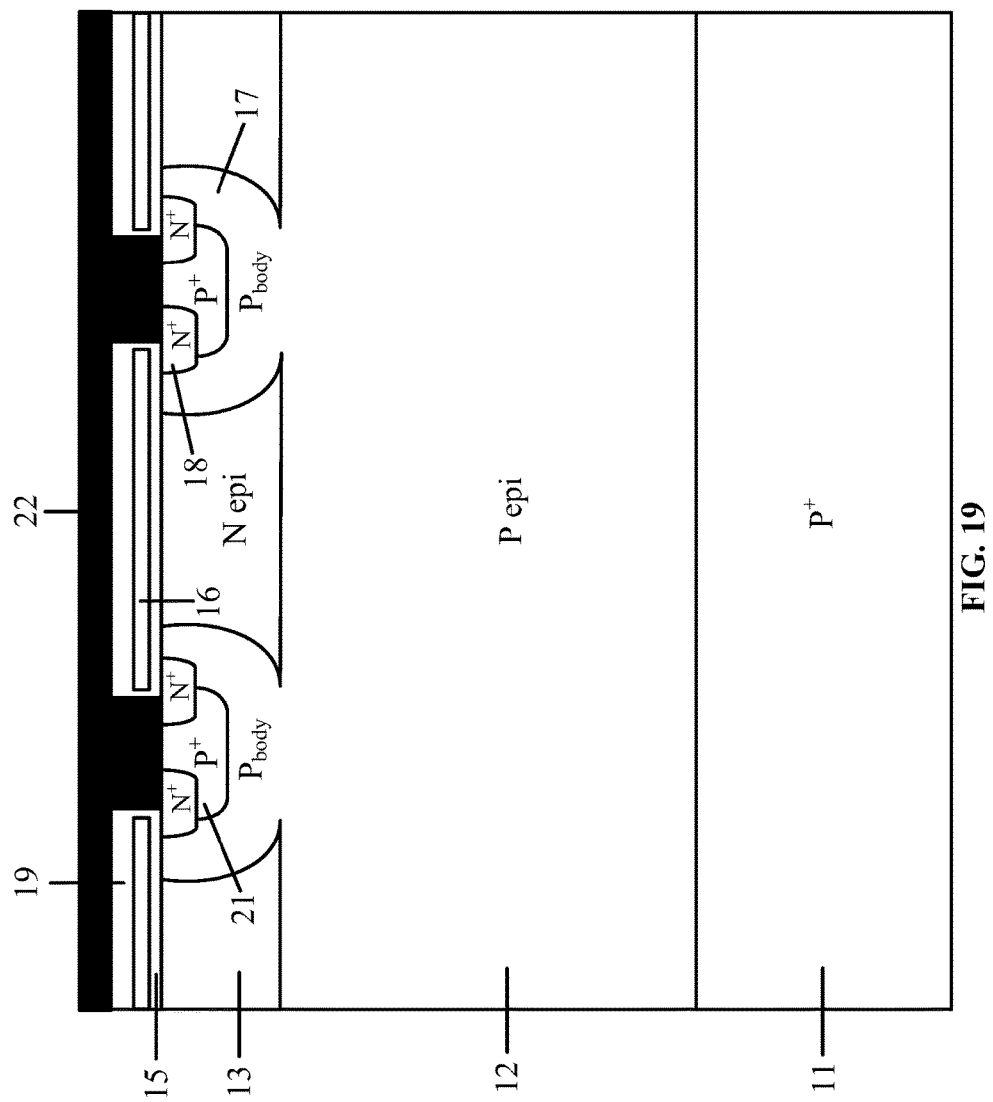
FIG. 19 is a schematic cross-sectional view of metallizing the top surface and thinning at the back surface in accordance with an embodiment.

(12) Metallizing the top surface and depositing aluminum layer with thickness of 1-4 µm to form the emitter 22, as shown in FIG. 19. Meanwhile, thin the back surface of the silicon to 53 µm.

Figure 20:
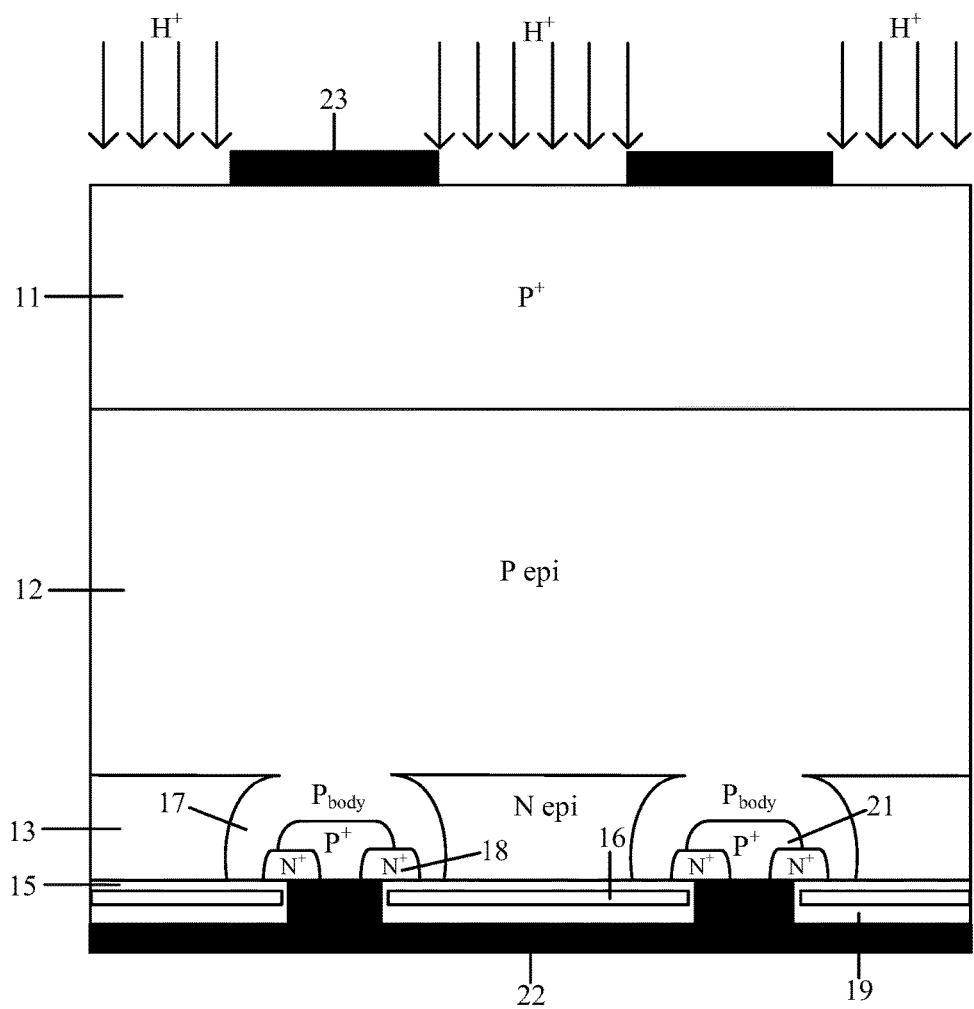
FIG. 20 is a schematic cross-sectional view of selectively implanting $H^+$ ions at the back surface, repeatedly, according to an embodiment.

(13) Selectively implanting H+ ions at the back surface repeatedly, as shown in FIG. 20. The implantation energy, projected range and dose, every time, are as follows, in order:

The $1^{st}$ time: 1 MeV, $R_P$=16.33 µm, 8e13-3e14 $cm^{-2}$;
The $2^{nd}$ time: 1.2 MeV, $R_P$=21.48 µm, 1e14-5e14 $cm^{-2}$;
The $3^{rd}$ time: 1.4 MeV, $R_P$=27.22 µm, 2e14-6e14 $cm^{-2}$;
The $4^{th}$ time: 1.6 MeV, $R_P$=33.50 µm, 3e14-8e14 $cm^{-2}$;
The $5^{th}$ time: 1.8 MeV, $R_P$=40.33 µm, 5e14-9e14 $cm^{-2}$;
The $6^{th}$ time: 2 MeV, $R_P$=47.69 µm, 7e14-1e15 $cm^{-2}$.

Figure 21:
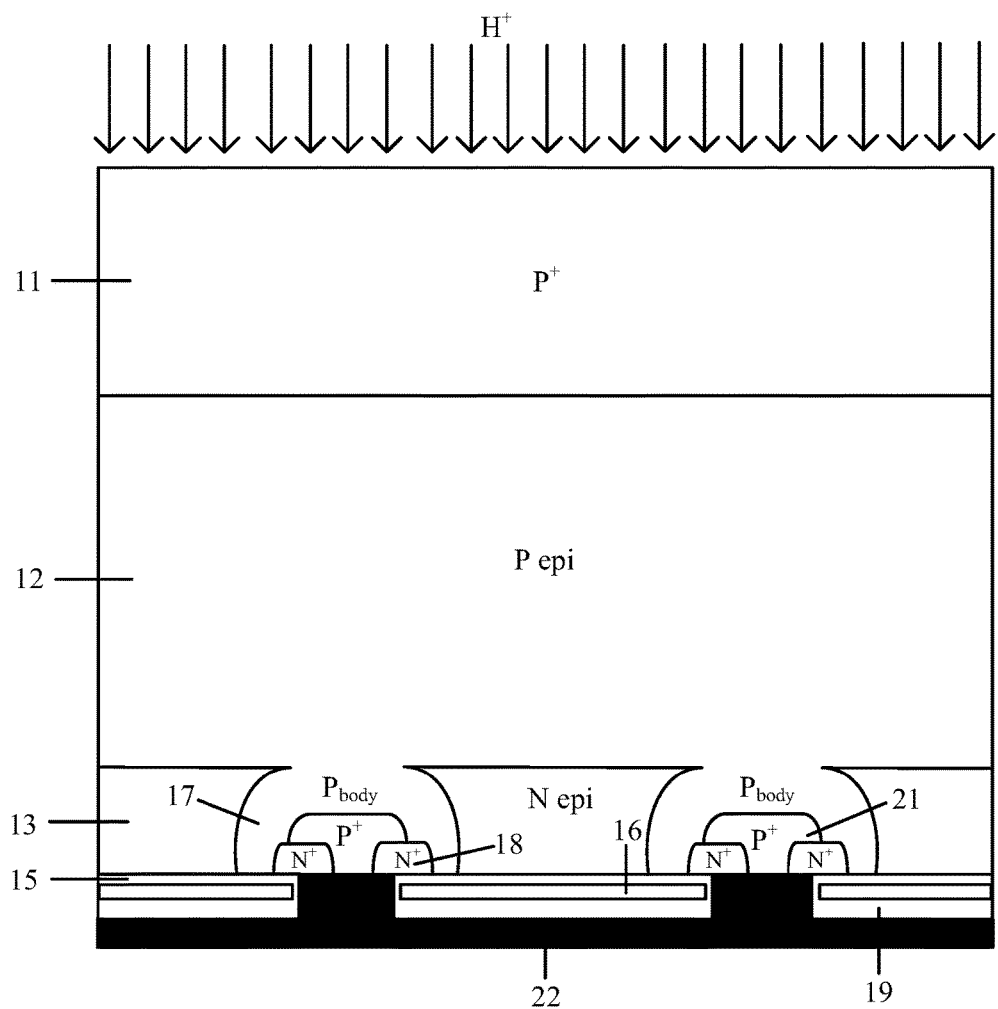
FIG. 21 is a schematic cross-sectional view of implanting $H^+$ ions at the back surface, repeatedly, in accordance with an embodiment.
Figure 22:
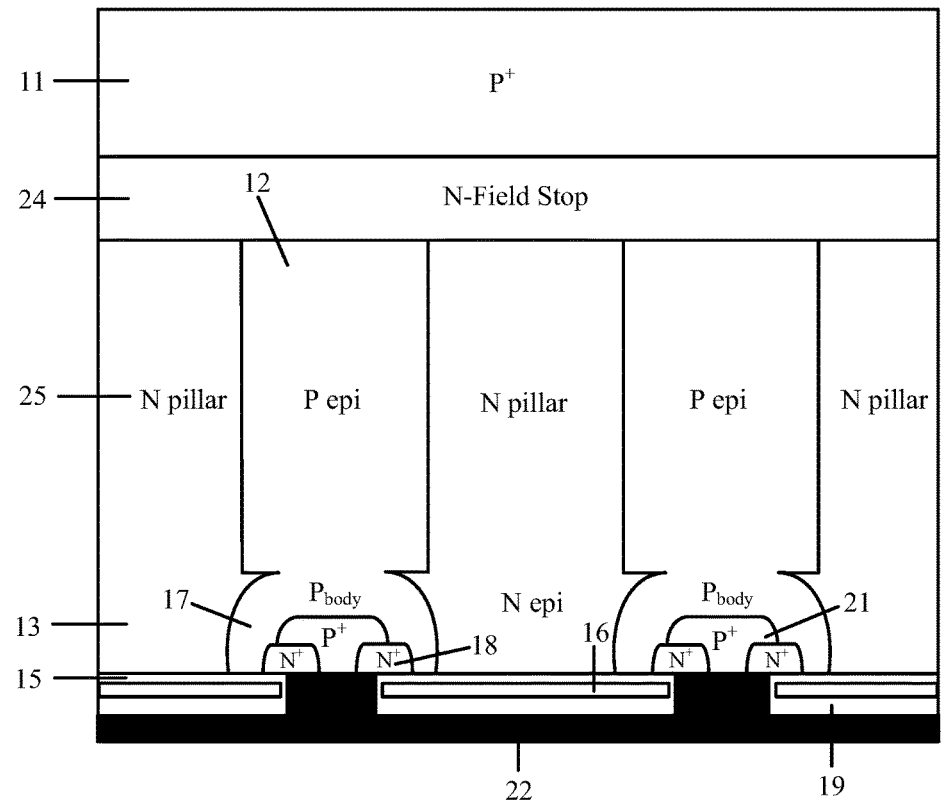
FIG. 22 is a schematic cross-sectional view of annealing at low temperature, according to an embodiment.

(14) Implanting H+ ions at the back surface repeatedly, as shown in FIG. 21. The implantation energy, projected range and dose, every time, are as follows, in order:

The $1^{st}$ time: 700 KeV, $R_P$=9.67 µm, 8e14-3e15 $cm^{-2}$;
The $2^{nd}$ time: 800 KeV, $R_P$=11.74 µm, 1e15-5e15 $cm^{-2}$.

(15) Annealing at low temperature to form N pillars 25 and an N-Field stop layer 24. The annealing temperature and time are 350-470 degree centigrade and 180-300 minutes.

Figure 23:
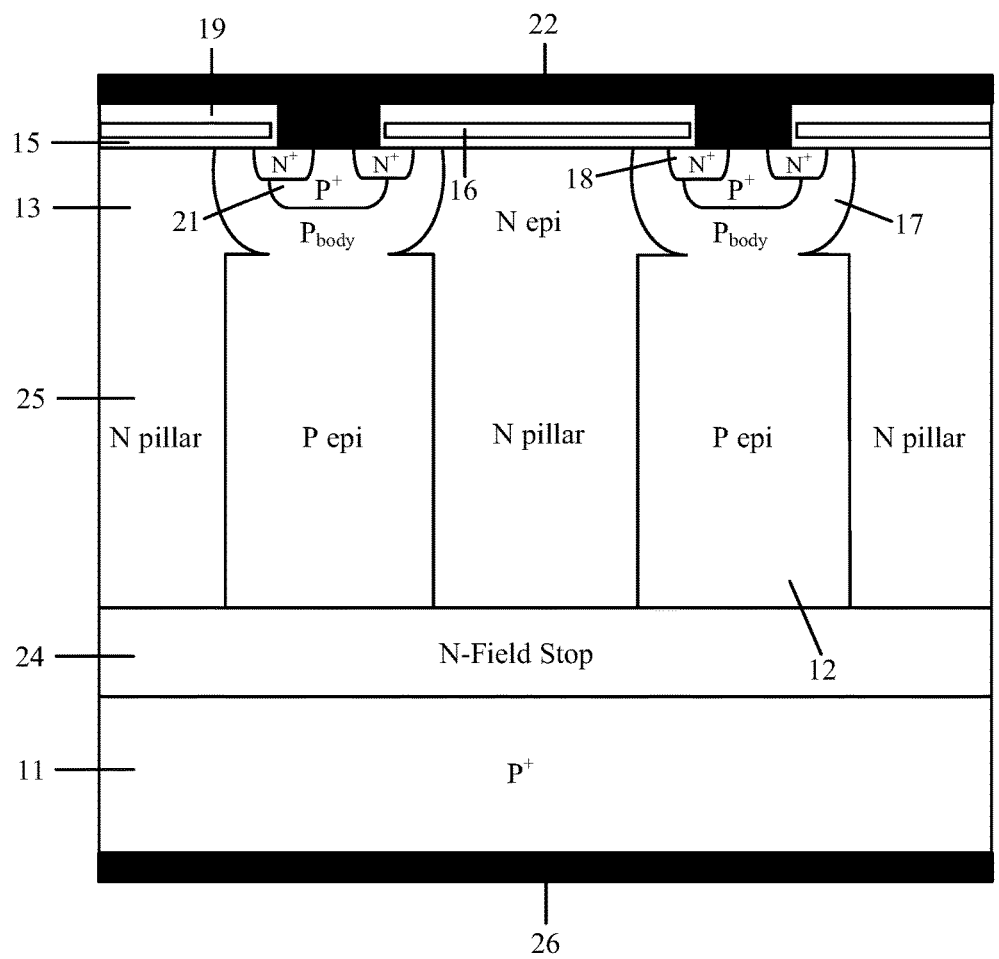
FIG. 23 is a schematic cross-sectional view of metallizing the back surface in accordance with an embodiment.

(16) Metallizing the back surface to form the emitter 26, as shown in FIG. 23. The thickness of aluminum deposited is 1-4 µm.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications that fall within the true spirit and scope of the invention.

The invention claimed is:

1. A method for manufacturing a vertical super junction drift layer for power semiconductor devices, the method comprising:
   a): using a P+ single crystal silicon to prepare a P+ substrate;
   b1: forming a P-type region through epitaxial growth on the P+ substrate;
   b2: forming an N-type region through epitaxial growth on the P-type region;
   b3: growing a field oxide layer on the N-type region;
   b4: etching an active area in the N-type region;
   b5: growing a gate oxide on the N-type region;
   b6: depositing and etching polysilicon on the gate oxide;
   b7: implanting boron ions in the N-type region and then performing a drive-in to form a P-body base region;
   b8: implanting arsenic ions in the P-body base region and then performing a drive-in to form an $N^+$ source region;
   b9: depositing boro-phospho-silicate-glass (BPSG) on the P-body base region and then reflowing the BPSG;
   b10: etching contact holes on the P-body base region;
   b11: implanting boron ions in the P-body base region and then annealing to form a P+ contact region; and
   b12: metallizing a top surface of the P+ substrate and forming an emitter on the BPSG;
   c): thinning a back surface of the P+ single crystal silicon;
   d): selectively implanting $H^+$ ions at the back surface of the P+ single crystal silicon repeatedly, and then annealing to form N pillars in the P-type region; and
   e): metallizing the back surface of the P+ single crystal silicon.

2. The method of claim 1, wherein d) further comprises: selectively implanting $H^+$ ions at the back surface of the P+ single crystal silicon repeatedly and annealing to form the N pillars in the P-type region, and repeating implanting $H^+$ ions and then annealing to form an N-Field stop layer between the P+ substrate and the N pillars.

3. A method for manufacturing a vertical super junction drift layer of power semiconductor devices, the method comprising:
   a): using a P+ single crystal silicon to prepare a P+ substrate;
   b1: forming an N-Field stop layer through epitaxial growth on the P+ substrate;
   b2: forming a P-type region through epitaxial growth on the N-Field stop layer;
   b3: forming an N-type region through epitaxial growth on the P-type region;
   b4: growing a field oxide layer on N-type region;
   b5: etching an active area in the N-type region;
   b6: growing a gate oxide on the N-type region;
   b7: depositing and etching polysilicon on the gate oxide;
   b8: implanting boron ions in N-type region and then performing a drive-in to form a P-body base region;
   b9: implanting arsenic ions in the P-body base region and then performing a drive-in to form an $N^+$ source region;
   b10: depositing BPSG on the P-body base region and then reflowing the BPSG;
   b11: etching contact holes on the P-body base region;
   b12: implanting boron ions in the P-body base region and then annealing to form a P+ contact region; and
   b13: metallizing a top surface of the P+ substrate and forming an emitter on the BPSG;
   c): thinning a back surface of the P+ single crystal silicon;
   d): selectively implanting $H^+$ ions at the back surface of the P+ single crystal silicon repeatedly, and then annealing to form N pillars in the P-type region; and
   e): metallizing the back surface of the P+ single crystal silicon.

4. A method for manufacturing a vertical super junction drift layer for power semiconductor devices, the method comprising:
   a): using a P+ single crystal silicon to prepare a P+ substrate;
   b1: forming a P-type region through epitaxial growth on the P+ substrate;
   b2: implanting phosphorus ions or arsenic ions at a top surface of the P-type region and then performing a drive-in to form an N-type region in the P-type region;
   b3: growing a field oxide layer on the N-type region;
   b4: etching an active area in the N-type region;
   b5: growing a gate oxide on the N-type region;
   b6: depositing and etching polysilicon on the gate oxide;
   b7: implanting boron ions in N-type region and then performing a drive-in to form a P-body base region;
   b8: implanting arsenic ions in the P-body base region and then performing a drive-in to form an $N^+$ source region;
   b9: depositing BPSG on the P-body base region and then reflowing the BPSG;
   b10: etching contact holes on the P-body base region;
   b11: implanting boron ions in the P-body base region and then annealing to form a P+ contact region; and
   b12: metallizing a top surface of the P+ substrate and forming an emitter on the BPSG;
   c): thinning a back surface of the P+ single crystal silicon;
   d): selectively implanting $H^+$ ions at the back surface of the P+ single crystal silicon repeatedly, and then annealing to form N pillars in the P-type region; and
   e): metallizing the back surface of the P+ single crystal silicon.

5. The method of claim 4, wherein d) further comprises: selectively implanting $H^+$ ions at the back surface of the P+ single crystal silicon repeatedly and annealing to form the N pillars in the P-type region, and repeating implanting $H^+$ ions and then annealing to form an N-Field stop layer between the P+ substrate and the N pillars.

6. A method for manufacturing a vertical super junction drift layer for power semiconductor devices, the method comprising:
   a): using a P+ single crystal silicon to prepare a P+ substrate;
   b1: forming an N-Field stop layer through epitaxial growth on the P+ substrate;
   b2: forming a P-type region through epitaxial growth on the N-Field stop layer;
   b3: implanting phosphorus ions or arsenic ions at a top surface of the P-type region and then performing a drive-in to form an N-type region in the P-type region;
   b4: growing a field oxide layer on the N-type region;
   b5: etching an active area in the N-type region;
   b6: growing a gate oxide on the N-type region;
   b7: depositing and etching polysilicon on the gate oxide;
   b8: implanting boron ions in N-type region and then performing a drive-in to form a P-body base region;
   b9: implanting arsenic ions in the P-body base region and then performing a drive-in to form an $N^+$ source region;
   b10: depositing BPSG on the P-body base region and then reflowing the BPSG;
   b11: etching contact holes on the P-body base region;
   b12: implanting boron ions in the P-body base region and then annealing to form a P+ contact region; and b13: metallizing a top surface of the P+ substrate and forming an emitter on the BPSG;

c): thinning a back surface of the P+ single crystal silicon;

d): selectively implanting $H^+$ ions at the back surface of the P+ single crystal silicon repeatedly, and then annealing to form N pillars in the P-type region; and e): metallizing the back surface of the P+ single crystal silicon.

\* \* \* \* \*